(12) United States Patent
Huang (10) Patent No.: US 9,082,760 B2
(45) Date of Patent: Jul. 14, 2015

(54) DUAL LAYERED LEAD FRAME

(71) Applicant: Chang Wah Technology CO., LTD., Kaohsiung (TW)

(72) Inventor: Chia-Neng Huang, Kaohsiung (TW)

(73) Assignee: CHANG WAH TECHNOLOGY CO., LTD., Kaohsiung (TW)

(*) Notice: Subject to any disclaimer, the term of this patent is extended or adjusted under 35 U.S.C. 154(b) by 0 days.

(21) Appl. No.: 14/304,990

(22) Filed: Jun. 16, 2014

(65) Prior Publication Data

US 2014/0345931 A1    Nov. 27, 2014

(51) Int. Cl.
| | |
|---|---|
| H05K 7/00 | (2006.01) |
| H01L 23/495 | (2006.01) |
| H01L 33/62 | (2010.01) |
| H01L 23/498 | (2006.01) |
| H01L 23/00 | (2006.01) |

(52) U.S. Cl.
CPC .... H01L 23/49534 (2013.01); H01L 23/49537 (2013.01); H01L 23/49548 (2013.01); H01L 23/49861 (2013.01); H01L 33/62 (2013.01); H01L 24/16 (2013.01); H01L 2224/16245 (2013.01)

(58) Field of Classification Search
CPC ............... H01L 23/49534; H01L 23/49537; H01L 23/49861; H01L 23/49548; H01L 33/62; H01L 24/16; H01L 2924/14; H01L 2224/48091; H01L 2224/48247; H05K 2201/10734; H05K 1/11; H05K 1/141

USPC .......... 174/260–261, 529, 536–537; 361/760, 361/767–770, 772
See application file for complete search history.

(56) References Cited

U.S. PATENT DOCUMENTS

| | | | | |
|---|---|---|---|---|
| 3,778,887 | A * | 12/1973 | Suzuki et al. | 29/827 |
| 5,920,113 | A * | 7/1999 | Chee et al. | 257/666 |
| 6,316,821 | B1 * | 11/2001 | Chang et al. | 257/666 |
| 6,489,218 | B1 * | 12/2002 | Kim et al. | 438/460 |
| 6,501,156 | B1 * | 12/2002 | Nakanishi et al. | 257/666 |
| 6,646,339 | B1 * | 11/2003 | Ku et al. | 257/708 |
| 6,743,696 | B2 * | 6/2004 | Jeung et al. | 438/458 |
| 6,867,072 | B1 * | 3/2005 | Shiu et al. | 438/123 |
| 7,153,724 | B1 * | 12/2006 | Sirinorakul et al. | 438/112 |
| 2005/0104169 | A1 * | 5/2005 | Huat et al. | 257/666 |
| 2010/0149773 | A1 * | 6/2010 | Said | 361/783 |
| 2013/0037927 | A1 * | 2/2013 | Rogren | 257/676 |

* cited by examiner

*Primary Examiner* — Hoa C Nguyen
(74) *Attorney, Agent, or Firm* — Chun-Ming Shih (57) ABSTRACT

A dual layered lead frame is provided with a die bonding layer and a solder layer. The dual layered lead frame has single lead frames arranged into a matrix layout with a cell gap formed between dual layered lead frame cells. Each dual layered lead frame cell includes a die bonding unit and a solder unit. The die bonding unit and the solder unit include conductive leads forming an insulating clearance between each and every conductive leads respectively. Each conductive lead includes slot holes. The insulating clearance, the slot holes, and the cell gap are filled with the insulating material so as to make the die bonding unit and the conductive lead of the solder unit, as well as the insulating clearance and the slot hole to match with one another and joined closely respectively.

23 Claims, 7 Drawing Sheets

DUAL LAYERED LEAD FRAME

BACKGROUND OF THE INVENTION

1. Field of the Invention

The invention relates to a lead frame for light-emitting diode (LED), particularly a dual layered lead frame structure for the flip chip packaging process of LED.

2. Description of Related Art

The conventional flip chip packaging of a high-power LED has been primarily known to use ceramic substrates. The ceramic substrates contain ceramic base material and conductive pattern. The conventional ceramic base material is a single layer one containing conductive through holes. The surface of the ceramic base material is covered with copper foil and heated afterward at a high temperatures (1065~1085° C.) to cause copper foil and the ceramic base material being eutectic together. The high temperature melt copper foil will be filled in the through holes forming conductive leads. The electric circuitry of the LED will be formed on the ceramic substrate by etching process. The ceramic base material substrate is made from aluminum nitride or aluminum oxide formed by burning at a high temperatures (850~900° C.).

Figure 1:
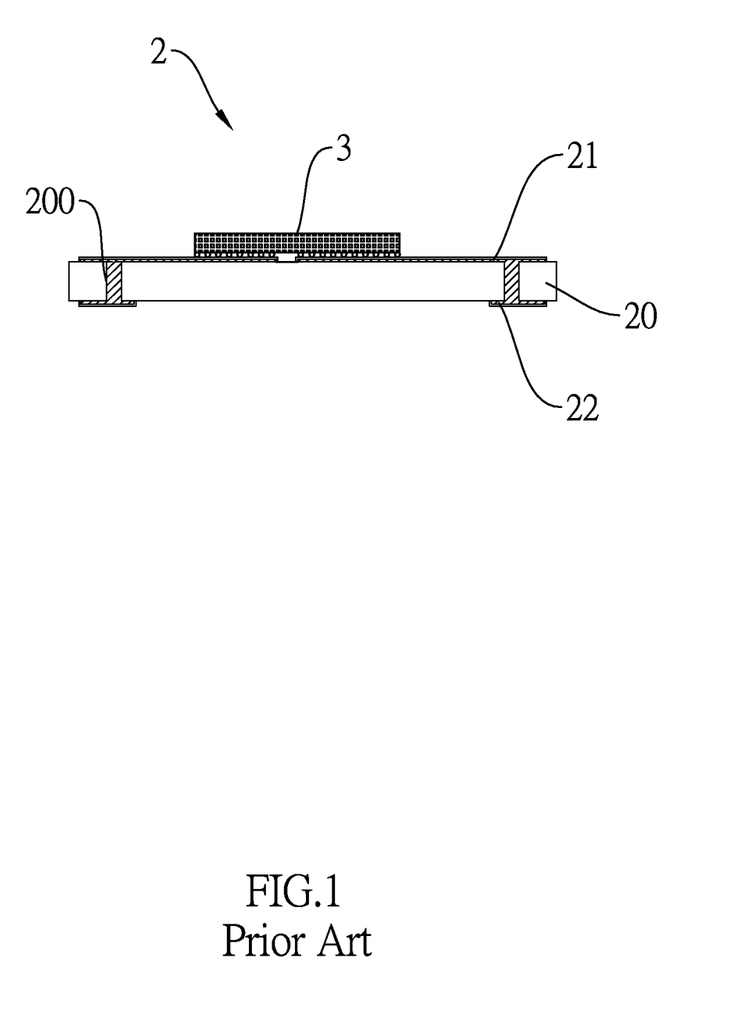
FIG. 1 is a schematic diagram of a conventional ceramic substrate.

As shown in FIG. 1 which is a sectional view of a conventional lead frame, the ceramic substrate 2 is constructed with a die bonding unit 21 which supports the LED chip 3, a ceramic base material 20 and a solder unit 22. The ceramic base material 20 is made of aluminum nitride or aluminum oxide and the ceramic base material 20 form with a conductive body hole 200. The ceramic base material 20 is formed by using a high temperature burning process. The ceramic base material 20 is made of aluminum nitride or aluminum oxide mixed with glass material and the cohesive agent uniformly to become pulpy slurries. It is then formed into a sheet to be heated. The entire ceramic substrate 2 is also formed by using a high temperature heating process to eutectic copper foil to the ceramic base material 20. It is understood that the cost of manufacturing the ceramic substrate 2 is higher than the same for manufacturing a lead frame. Also, the ceramic substrate 2 may easily be damaged to break, and has low mechanical durability. The heat dissipation of the ceramic substrate 2 is mainly through the ceramic substrate material. The coefficient of thermal conductivity of ceramic base material 20 made of aluminum nitride is about 170~230 W/Mk. The coefficient of thermal conductivity of ceramic base material 20 made of aluminum oxide is about 20~24 W/mK. Comparatively, the coefficient of thermal conductivity of copper used in the lead frame is about 398 W/mK. Therefore, the thermal conductivity efficiency of the ceramic base material 20 is much lower than the same of the lead frame.

Notwithstanding the prior art, the invention is neither taught nor rendered obvious thereby.

SUMMARY OF THE INVENTION

The principal objective of invention is to provide a dual layered lead frame wherein the lead clearance between leads tip, has been minimized so as to meet the requirements of the micro flip chip packaging technology.

Another objective of the invention is to provide a dual layered lead frame wherein the die bonding layer and solder layer is made of copper, iron or aluminum with an appropriate thinness to achieve fine clearance.

A further objective of the invention is to provide a lead frame using the cohesive unit to glue the die bonding layer and the solder layer together with an insulating material applied to bond the die bonding layer and the solder layer tightly together, making the dual layered lead frame to have higher mechanical durability.

A further objective of the invention is to provide a dual layered lead frame having a cohesive unit being a conductive paste, which can increase the accuracy and compactness of each glued lead of the die bonding unit and the solder unit, and thus to improve the efficiency of the packaging process.

Advantages of the dual layered lead frame according to the invention are good thermal conductivity, high mechanical durability, and low manufacture cost because the material of the cohesive unit is gold, silver or tin so that each lead of the die bonding unit and the solder unit being joined together by eutectic.

According to the various objects and advantages of the dual layered lead frame, a primary features of the same are connecting and conducting die bonding layer and solder layer directly with insulating material, or providing a cohesive layer in between for the contact of die bonding layer and solder layer, or providing cohesive units to eutectic connection of the die bonding layer and solder layer.

A primary feature of the dual layered lead frame according to the invention is to provide insulating clearances and slot holes of the die bonding unit and the solder unit are formed by stamping or etching process. The insulating clearance and slot holes of the die bonding unit and the solder unit appear to be in a T-shaped or inverted T-shaped form by etching process.

Another aspect of the invention is the use of insulating materials which are thermosetting material or a thermoplastic material.

A further aspect of the invention is to provide plating metal layers at the upper surface of the conductive lead of the die bonding unit and the bottom surface of the conductive lead of the solder unit and these metal layers are plated with material of one selected from silver, gold, nickel, palladium and tin or combination thereof.

Another aspect of the invention is to have a thickness of the die bonding unit to be smaller, larger or equal to the same of the solder unit. In a preferred embodiment, the width of the insulating clearance of the die bonding unit is smaller than the width of the insulating clearance of the soldering unit so as to achieve a minimum width for the requirements of packaging process.

Still another aspect of the invention is to provide a die bonding unit which includes a plurality of conductive leads with an insulating clearance formed between each conductive lead individually. The solder unit includes a plurality of conductive leads with an insulating clearance formed between each conductive lead individually. Insulating material is used to fill in the insulating clearance of the die bonding unit and the solder unit.

Yet another aspect of the invention is to provide a cohesive unit located between the die bonding unit and the solder unit so that conductive leads of the die bonding unit and conductive leads of the solder unit, as well as the insulating clearance of the die bonding unit and insulating clearance of the solder unit match with one another and are joined closely respectively.

Another aspect of the invention is to provide a plurality of slot holes also filled with insulating materials. The insulating clearance and slot holes of the die bonding unit and the solder unit are formed by stamping or etching process. The insulating clearance and slot holes of the die bonding unit and the solder unit are formed a T-shaped or inverted T-shaped form by etching process.

Accordingly, the dual layered lead frame according to the invention comprises a die bonding layer and a solder layer joined together. The dual layered lead frame has a plurality of dual layered lead frame cells arranged into a matrix layout with a cell gaps formed between each dual layered lead frame cell individually. The dual layered lead frame cell includes a die bonding unit and a solder unit where each of them includes a plurality of conductive leads wherein an insulating clearance is formed between each conductive lead individually and each conductive lead includes a plurality of slot holes. The insulating clearance of the die bonding unit, the insulating clearance of the solder unit, and each slot hole are formed by stamping or etching process, and the insulating clearance and slot holes are in a T-shaped or inverted T-shaped form by etching process. An insulating material of a thermosetting material or a thermoplastic material is used to fill the insulating clearance of the die bonding unit, the insulating clearance of the soldering unit, each slot hole and cell gap so that conductive leads of the die bonding unit and the solder unit, as well as insulating clearance and the slot holes match with one another and are joined closely. An upper surface of the conductive lead of the die bonding unit and the bottom surface of the conductive lead of the solder unit are plated with plating metal layers wherein the thickness of the die bonding unit is smaller, larger or equal to that of the soldering unit. The width of the insulating clearance of the die bonding unit is smaller, larger or equal to the minimum width of the insulating clearance of the soldering unit. In addition, the width of the insulating clearance in the die bonding unit is minimized to meet the requirements of the micro flip chip packaging technology.

The joint of the die bonding layer and the solder layer also can include a cohesive layer. The cohesive layer is located between the die bonding unit and the solder unit, so that respective conductive leads of the die bonding unit and conductive leads of the solder unit, as well as respective insulating clearance of the die bonding unit and solder unit correspondingly to be joined closely with one another respectively.

The above and other objects, features and advantages of the invention will become apparent from the following detailed description taken with the accompanying drawings.

DETAILED DESCRIPTION OF THE INVENTION

Figure 2:
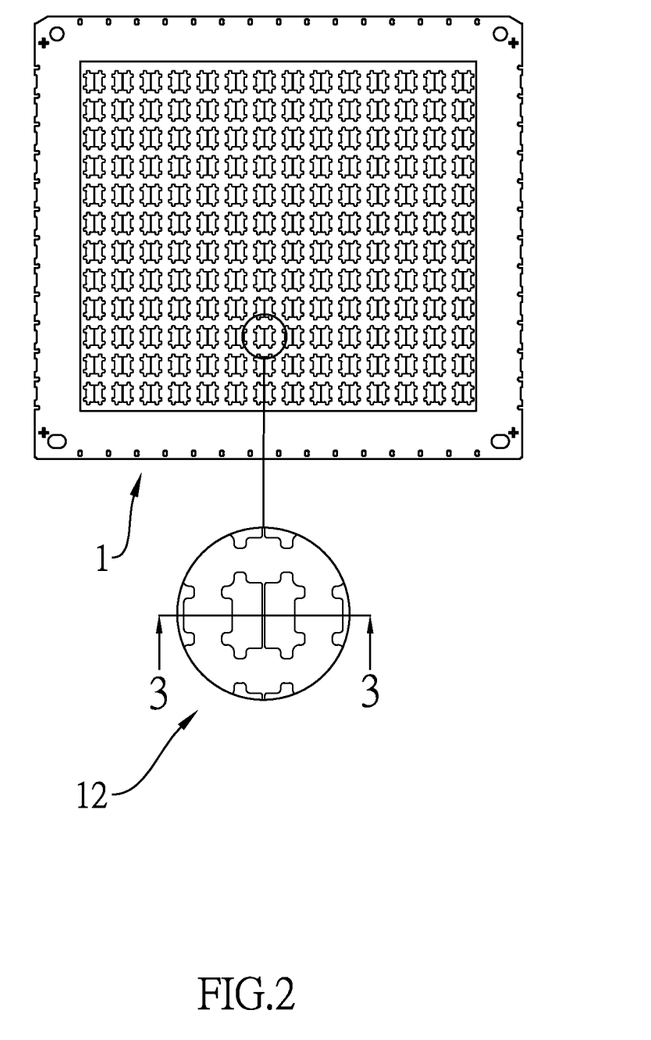
FIG. 2 is a plan view of a first preferred embodiment of a dual layered frame according to the invention.
Figure 3:
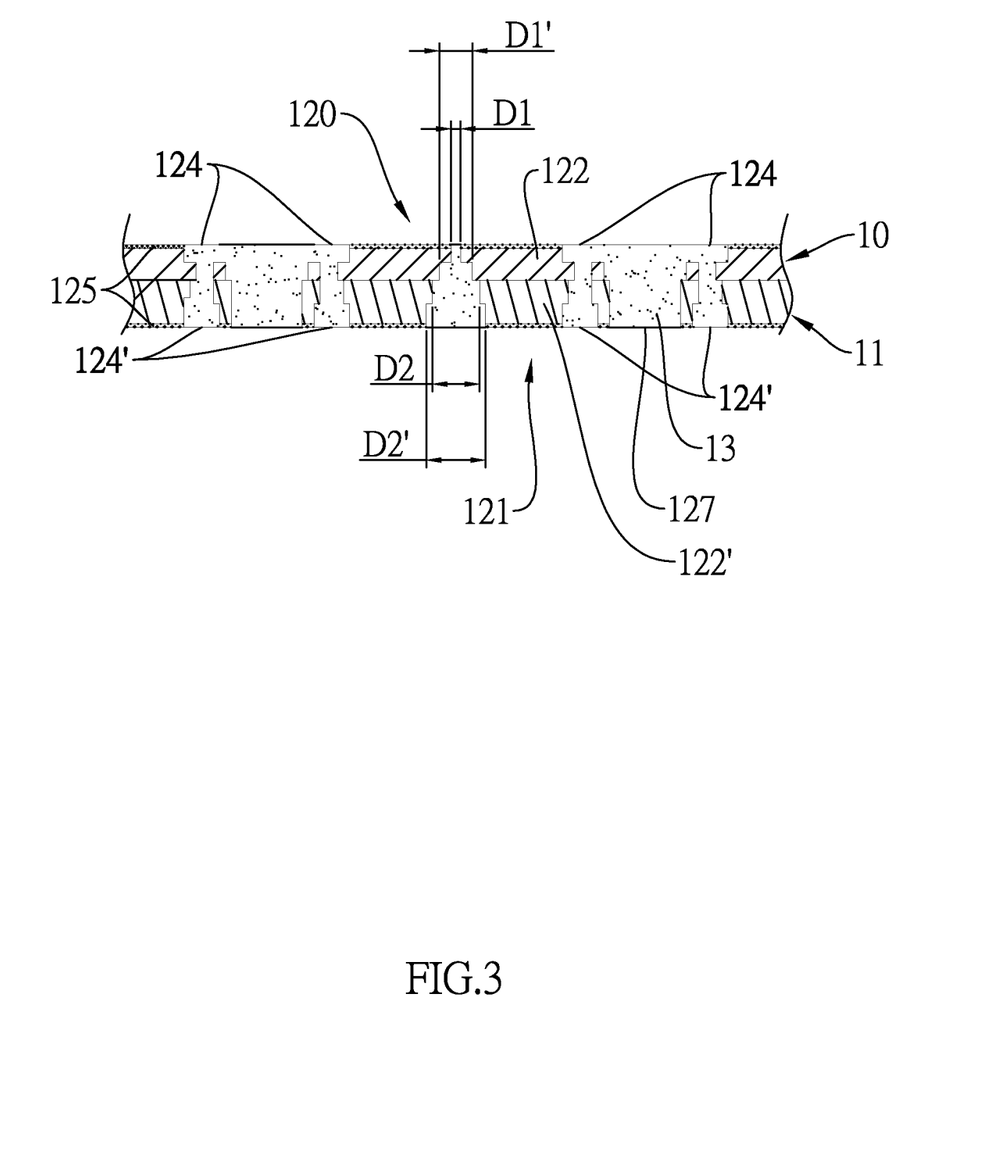
FIG. 3 is a sectional view taken along line 3-3 of FIG. 2.

Referring to FIGS. 2 and 3, a plan view and a sectional view of a first preferred embodiment of the dual layered lead frame according to the invention are shown. The dual layered lead frame 1 is composed of a die bonding layer 10 and a solder layer 11. The structure of the dual layered lead frame 1 has a plurality of dual layered lead frame cells 12 arranged into a matrix layout wherein a cell gap 127 is formed between dual layered lead frame cells 12, and each dual layered lead frame cell 12 comprises a die bonding unit 120 and a solder unit 121.

The die bonding unit 120 includes a plurality of first conductive leads 122 wherein a first insulating clearance D1, D1' is formed between each first conductive lead 122 individually. The solder unit 121 includes a plurality of second conductive leads 122' wherein a second insulating clearance D2, D2' is formed between the second conductive leads 122' individually. The material of the first conductive lead 122 of the die bonding unit 120 and the solder unit 121 is made of copper, iron or aluminum. Each of the first and second conductive leads 122 and 122' include a plurality of first and second slot holes 124 and 124' respectively. The first insulating clearance D1, D1' of the die bonding unit 120, the second insulating clearance D2, D2' of the solder unit 121, the first and second slot holes 124 and 124' of the die bonding unit 120, the first and second slot holes 124 and 124' of the solder unit 121 and the cell gaps 127 are filled with insulating material 13. The insulating material may be a thermosetting material or a thermoplastic material. The first conductive leads 122 of the die bonding unit 120 and the second conductive leads 122' of the solder unit 121 are joined together tightly. The first insulating clearance D1, D1' and the first slot holes 124 of the die bonding unit 120 are aligned with the second insulating clearance D2, D2' of the second conductive leads and the second slot holes 124' of the solder unit 121. The first insulating clearance D1, D1' of the die bonding unit 120, the second insulating clearance D2, D2' of the solder unit 121, and each first and second slot holes 124 and 124' are prepared by stamping or etching process, and the insulating clearance D1,D1', D2, D2', first slot holes 124 and second slot holes 124' are in a T-shaped or inverted T-shaped form by etching process.

On the upper surface of the first conductive lead 122 of the die bonding unit 120 and the bottom surface of the second conductive lead 122' of the solder unit 121 are plated with a plating metal layers 125 wherein the material of the plating metal layers 125 can one selected from silver, gold, nickel, palladium and tin or combination thereof. The thickness of the die bonding unit 120 is smaller, larger or equal to that the same of the solder unit 121. The minimum width of the insulating clearance D1, D1' of the die bonding unit 120 is smaller than the minimum width of the insulating clearance D2, D2' of the solder unit 121 in this preferred embodiment but they can be equal or larger. For the purpose to meet the requirements of the micro flip chip technology, the thickness of the die bonding unit 120 is designed to be smaller than the same of the solder unit 121 and the width of the first insulating clearance D1 of the die bonding unit 120 is smaller than the width of the second insulating clearance D2 of the soldering unit 121. In another words, the best design is to minimize the width of the first insulating clearance D1.

Figure 4:
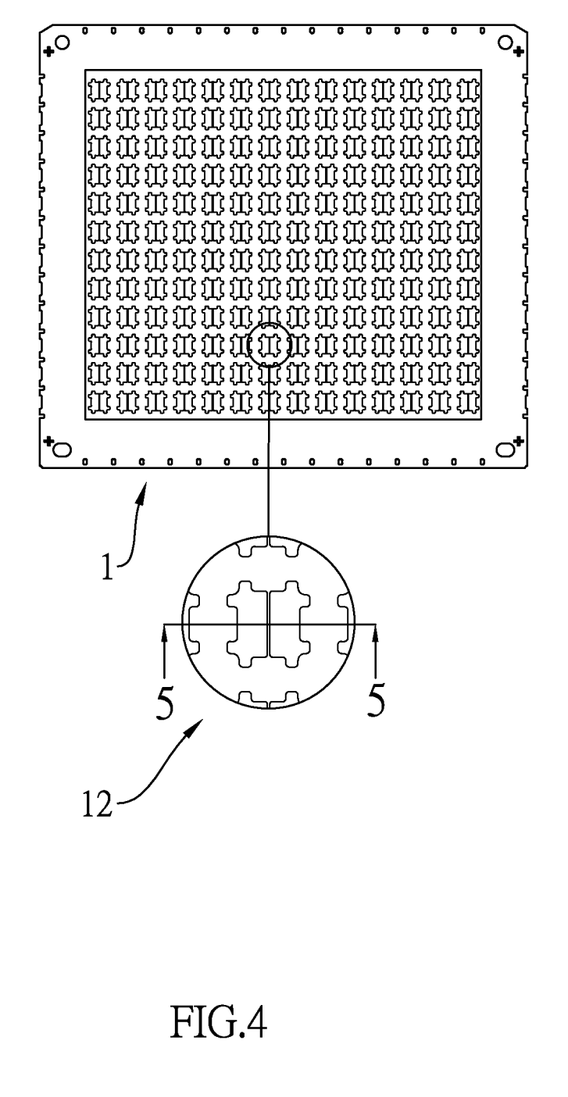
FIG. 4 is a plan view of a second preferred embodiment of a dual layered frame according to the invention.
Figure 5:
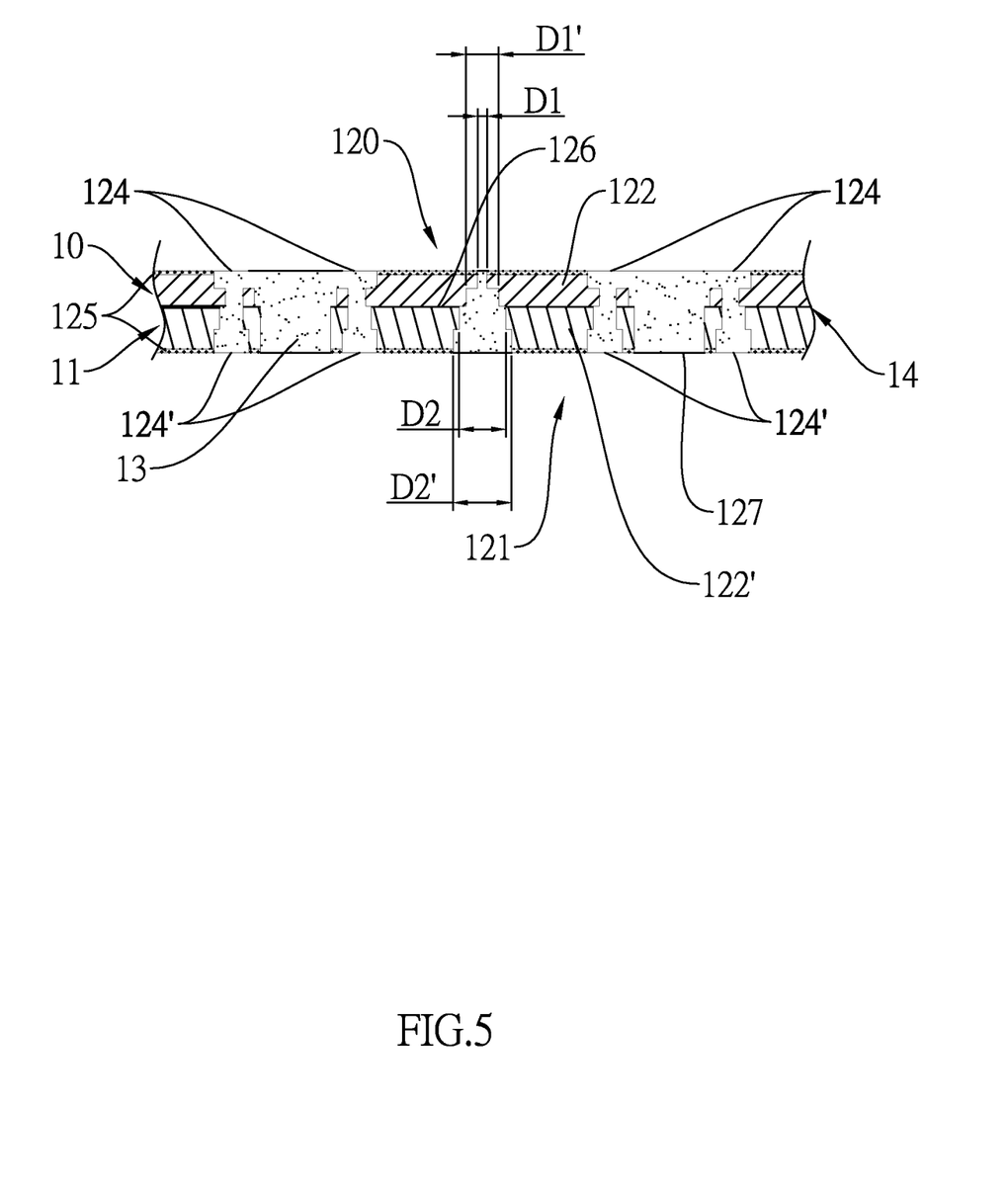
FIG. 5 is a sectional view taken along line 5-5 of FIG. 4.

Referring to FIGS. 4 and 5, a plan view and a sectional view of a second preferred embodiment of the dual layered lead frame according to the invention are shown. The dual layered lead frame 1 is composed of a die bonding layer 10 and a solder layer 11. As the same in the first preferred embodiment, the structure of the dual layered lead frame I comprises a plurality of dual layered lead frame cells 12 arranged into a matrix layout wherein a cell gap 127 is formed between each dual layered lead frame cell 12 respectively. In this embodiment, the characteristic feature of the structure is a cohesive layer 14 formed between the die bonding layer 10 and the solder layer 11. Therefore, each dual layered lead frame cell 12 comprises a die bonding unit 120, a cohesive unit 126 and a solder unit 121. In this second preferred embodiment and for illustrative purpose, the corresponding structure elements like the same in the first preferred embodiment shall use the same numerals as those shown in FIGS. 2 and 3. The die bonding unit 120 includes a plurality of conductive leads 122 wherein an insulating clearance D1, D1' being formed between each conductive leads 122 respectively. The solder unit 121 includes a plurality of conductive leads 122' wherein an insulating clearance D2, D2' being formed between each conductive lead 122' respectively. The insulating clearance D1, D1' of the die bonding unit 120, the insulating clearance D2, D2' of the solder unit 121, the first and second slot holes 124 and 124' of the die bonding unit 120, the first and second slot holes 124 and 124' of the solder unit 121 and the cell gaps 127 are filled with insulating material 13. The insulating material may be a thermosetting material or a thermoplastic material. The cohesive unit 126 can be a conductive paste, making the conductive lead 122 of the die bonding unit 120 and the conductive lead 122' of the solder unit 121 to be joined together tightly. The cohesive unit 126 will also make the corresponding insulating clearance D1' of the die bonding unit 120 and the insulating clearance D2 of the solder unit 121 to match and contacted with each other closely. Again, the insulating clearance D1, D1' of the die bonding unit 120 and the insulating clearance D2, D2' of the solder unit 121 are prepared by stamping or etching process, and the insulating clearance D1, D1', D2 and D2' are in a T-shaped or inverted T-shaped form by etching process. On the upper surface of the first conductive lead 122 of the die bonding unit 120 and the bottom surface of the second conductive lead 122' of the solder unit 121 are plated with a plated metal layers 125 wherein the material of the plated metal layers 125 can be one selected from silver, gold, nickel, palladium and tin or combination thereof. Each of the first and second conductive leads 122 and 122' include a plurality of first and second slot holes 124 and 124' respectively. The first insulating clearance D1, D1' of the die bonding unit 120, the second insulating clearance D2, D2' of the solder unit 121, the first and second slot holes 124 and 124' of the die bonding unit 120, the first and second slot holes 124 and 124' of the solder unit 121 and the cell gaps 127 are filled with insulating material 13. The insulating material may be a thermosetting material or a thermoplastic material. And in turn, it makes the die bonding unit 120 and the solder unit 121 to be joined closely.

Figure 6:
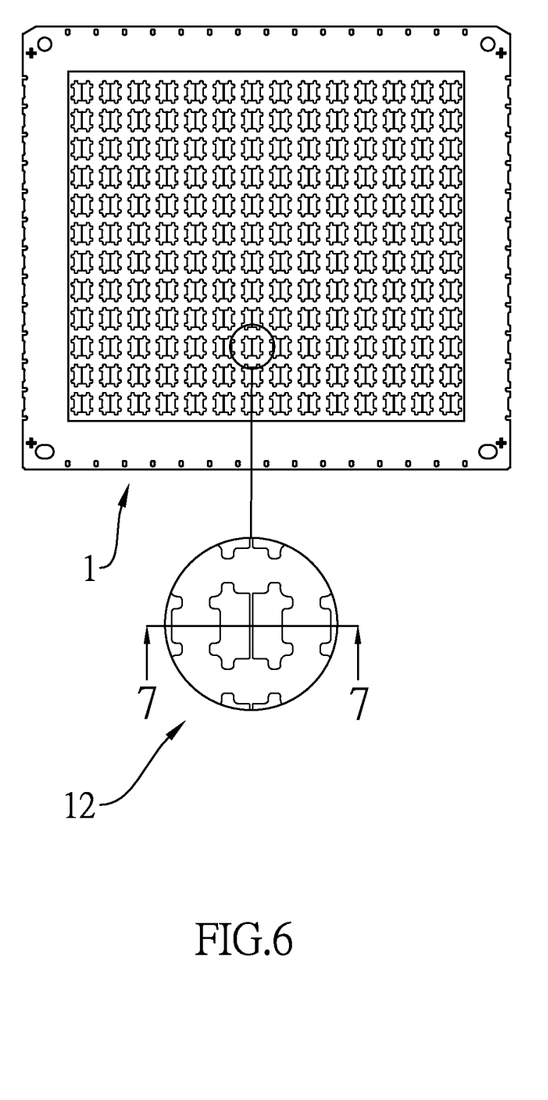
FIG. 6 is a plan view of a third preferred embodiment of a dual layered frame according to the invention.
Figure 7:
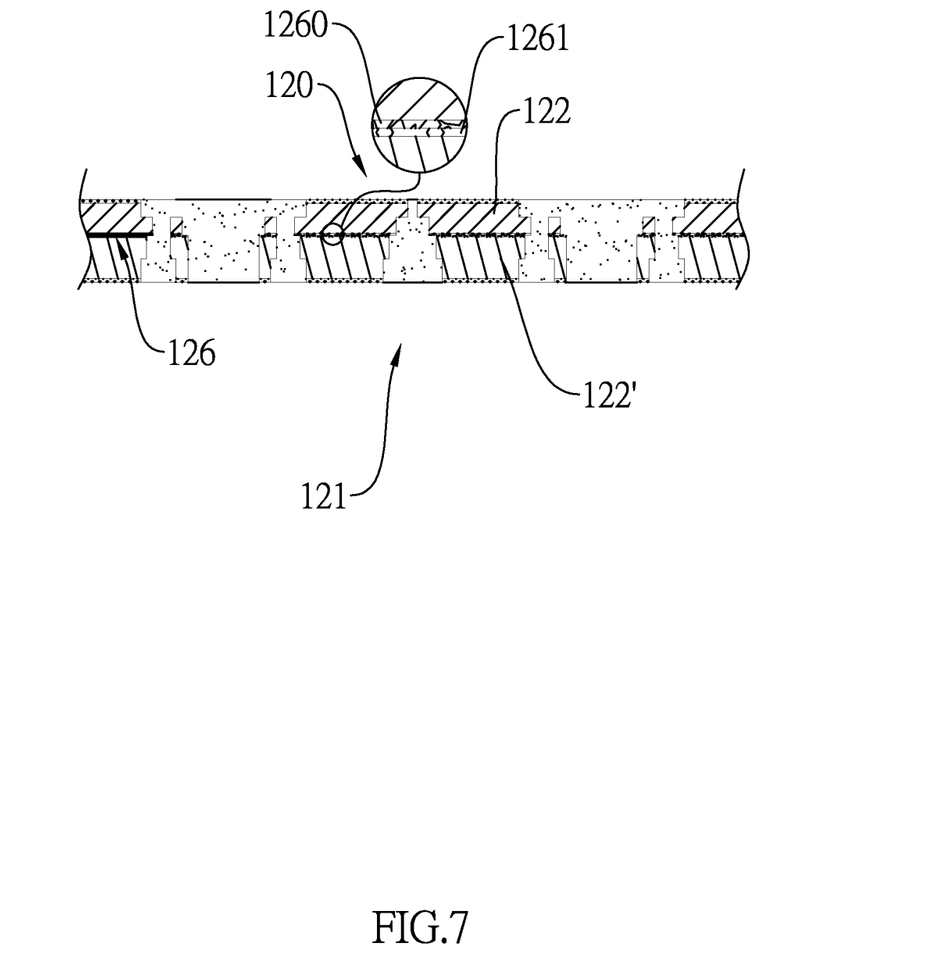
FIG. 7 is a sectional view taken along line 7-7 of FIG. 6.

Referring to FIGS. 6 and 7, a plan view and a sectional view of a third preferred embodiment of the dual layered lead frame according to the invention are shown. A cohesive unit 126 comprises a first cohesive unit 1260 and a second cohesive unit 1261. The first and second cohesive units are formed with eutectic materials of gold, silver or tin. With the cohesive unit 126 and by the close contact of first cohesive unit 1260 and second cohesive unit 1261, the die bonding unit 120 and conductive leads 122' of the solder unit 121 correspond to each other can be well joined together respectively by eutectic process.

While the invention has been described in terms of preferred embodiments, those skilled in the art will recognize that the invention can be practiced with modifications within the spirit and scope of the appended claims.

What is claimed is:

1. A dual layered lead frame comprising:
    a die bonding layer;
    a solder layer;
    a plurality of individually arranged dual layered lead frame cells to form into a matrix layout; and
    a plurality of cell gaps being formed between the dual layered lead frame cells, and each of the dual layered lead frame cells including a die bonding unit and a solder unit, wherein:
    the die bonding unit includes a plurality of first conductive leads and a first insulating clearance being formed between the first conductive leads, and each of the first conductive leads further comprises a plurality of first slot holes;
    the solder unit includes a plurality of second conductive leads and a second insulating clearance being formed between second conductive leads, and each of the second conductive leads further comprises a plurality of second slot holes; and
    an insulating material is filled in the respective first and second slot holes of the die bonding unit and the solder unit, the respective first and second insulating clearances of the die bonding unit and the solder unit, and the cell gaps, so that the first and second conductive leads are correspondingly joined closely.

2. The dual layered lead frame as claimed in claim 1, wherein the insulating clearance and the slot holes of the die bonding unit and the solder unit being formed to be in a T-shaped form.

3. The dual layered lead frame as claimed in claim 1, wherein the insulating clearance and the slot holes of the die bonding unit and the solder unit being formed to be in an inverted T-shaped form.

4. The dual layered lead frame as claimed in claim 1, further comprising a plurality of plated metal layers formed on the upper surface of the first conductive leads and the bottom surface of the second conductive leads.

5. The dual layered lead frame as claimed in claim 1, wherein the die bonding unit has a thickness being smaller than the same of the solder unit.

6. The dual layered lead frame as claimed in claim 1, wherein the die bonding unit has a thickness being equal to the same of the solder unit.

7. The dual layered lead frame as claimed in claim 1, wherein the die bonding unit has a thickness being larger than the same of the solder unit.

8. The dual layered lead frame as claimed in claim 1, wherein the first insulating clearance of the bonding unit has a width smaller than the same of the second insulating clearance of the solder unit.

9. The dual layered lead frame as claimed in claim 1, wherein the first insulating clearance of the bonding unit has a width equal to the same of the second insulating clearance of the solder unit.

10. The dual layered lead frame as claimed in claim 1, wherein the first insulating clearance of the bonding unit has a width larger than the same of the second insulating clearance of the solder unit.

11. A dual layered lead frame comprising:
    a die bonding layer;
    a cohesive layer;
    a solder layer;
    a plurality of individually arranged dual layered lead frame cells to form into a matrix layout;
    a plurality of cell gaps being formed between the dual layered lead frame cells, and each of the dual layered lead frame cells including a die bonding unit, a cohesive unit, and a solder unit, wherein:
    the die bonding unit includes a plurality of first conductive leads and a first insulating clearance being formed between the first conductive leads;
    the solder unit includes a plurality of second conductive leads and a second insulating clearance being formed between second conductive leads;
    an insulating material is filled in the first insulating clearance of the die bonding unit, the second insulating clearance of the solder unit, and the cell gaps; and a cohesive unit is located between the die bonding unit and the solder unit, so that the first conductive leads of the die bonding unit, the second conductive leads of the solder unit, the first insulating clearance of the die bonding unit, and the second insulating clearance of the solder unit are correspondingly joined with one another respectively.

12. The dual layered lead frame as claimed in claim 11, wherein the first conductive lead further comprises a plurality of first slot holes, and the second conductive lead further comprises a plurality of second slot holes and an insulating material being configured to fill in first and second slot holes.

13. The dual layered lead frame as claimed in claim 11, wherein the first and second insulating clearances and the first and second slot holes formed to be in a T-shaped form.

14. The dual layered lead frame as claimed in claim 11, wherein the first and second insulating clearances and the first and second slot holes formed to be in an inverted T-shaped form.

15. The dual layered lead frame as claimed in claim 11, further comprising a plurality of plated metal layers formed on the upper surface of the first conductive leads and the bottom surface of the second conductive leads.

16. The dual layered lead frame as claimed in claim 11, wherein the die bonding unit has a thickness being smaller than the same of the solder unit.

17. The dual layered lead frame as claimed in claim 11, wherein the die bonding unit has a thickness being equal to the same of the solder unit.

18. The dual layered lead frame as claimed in claim 11, wherein the die bonding unit has a thickness being larger than the same of the solder unit.

19. The dual layered lead frame as claimed in claim 11, wherein the first insulating clearance of the bonding unit has a width smaller than the same of the second insulating clearance of the solder unit.

20. The dual layered lead frame as claimed in claim 11, wherein the first insulating clearance of the bonding unit has a width equal to the same of the second insulating clearance of the solder unit.

21. The dual layered lead frame as claimed in claim 11, wherein the first insulating clearance of the bonding unit has a width larger than the same of the second insulating clearance of the solder unit.

22. The dual layered lead frame as claimed in claim 11, wherein the cohesive unit is a conductive paste.

23. The dual layered lead frame as claimed in claim 11, wherein the cohesive unit comprises a first cohesive unit and a second cohesive unit.

* * * * *